United States Patent [19]

McLeod et al.

[11] Patent Number: 4,900,518
[45] Date of Patent: Feb. 13, 1990

[54] GASEOUS ORGANIC/INORGANIC THERMAL CRACKER FOR VACUUM CHEMICAL EPITAXY

[75] Inventors: Paul M. McLeod, Berkeley; Lewis M. Fraas, El Sobrante; Robert E. Weiss, San Francisco, all of Calif.

[73] Assignee: DaidoSanso K. K., Osaka, Japan

[21] Appl. No.: 279,273

[22] Filed: Dec. 2, 1988

Related U.S. Application Data

[63] Continuation of Ser. No. 941,003, Dec. 12, 1986, abandoned.

[51] Int. Cl.$^4$ .............................................. F27D 11/02
[52] U.S. Cl. .................................................. 422/199
[58] Field of Search ......................... 422/199; 219/390

[56] References Cited

U.S. PATENT DOCUMENTS

| | | | |
|---|---|---|---|
| 699,146 | 5/1902 | Carn ..................................... | 422/199 |
| 3,541,293 | 11/1970 | MacDonald et al. ................ | 219/390 |
| 3,804,967 | 4/1974 | Werych ................................ | 219/390 |
| 4,397,431 | 8/1982 | Pearce et al. ........................ | 219/390 |
| 4,518,846 | 5/1985 | Freeouf et al. ...................... | 219/390 |
| 4,544,025 | 10/1985 | Aldrich et al. ....................... | 219/395 |

OTHER PUBLICATIONS

Lee et al., "Material Effects on the Cracking Efficiency of Molecular Beam . . ." J. Vac. Sci. Technol. B4(2), Mar./Apr. 1986, pp. 568–570.
Panish et al., "Gas Source MBE of InP and $Ga_xIn_{1-x}P_yAs_{1-y}$: Materials Properties . . ." J. Vac. Sci. Technol. B3(2), Mar./Apr. 1985, pp. 657"665.
Ando et al., "Metalorganic Molecular Beam Opitaxial Growth of AnSe Using . . ." Jap. Jorn. of Appl., vol. 25, No. 4, Apr. 1986, pp. L279–L281.
Huet et al., "Molecular Beam Epitaxy of $In_{0.53}GA_{0.47}As$ and InP by Using Cracker . . ." J. Vac. Sci. Technol B3(3), May/Jun. 1985, pp. 823–829.
L. M. Fraas et al., "Vacuum Chemical Epitaxy Utilizing Organomablic Sources", J. Elec. Materials, vol. 15, No. 3, pp. 175"180, May 1986.
L. D. Portain et al., "Vacuum MOCVD Fabrication of High Efficiency Cells for Multi-Junction Application," Space Photovoltaic Research & Tech. Conference, Apr. 30–May 2, 1985, pp. 1–9.
Research on Multiband Gap Solar Cells, SERI Semiannual Control Report, Mar. 31, 1985 to Aug. 31, 1985 submitted on or about Oct. 16, 1986 for initial approval and mailed to listed recipents on or about Dec. 16, 1985.
SERI Contract Monthly Report Apr. 1–30, 1985, Submitted May 15, 1985.
A. R. Calawa, "On the Use of $AsH_3$ in the Molecular Beam Epitaxial Growth of GaAs," Appl. Phys. Lett. 38 (9), 1 May 1981, pp. 701–703.
R. Chow et al., "Electrical and Optical Properties of InP Grown by Molecular Beam Epitaxy . . ." Appl. Phys. Letter 42(4), 15 Feb. 1983, pp. 383–385.
Kapitan et al., "On the Design and Characterization of a Novel Arsine Cracking . . ." J. Vac. Sci. Technol B2(2), Apr.–Jun. 1984, pp. 280–284.

*Primary Examiner*—Peter Kratz
*Attorney, Agent, or Firm*—Armstrong, Nikaido, Marmelstein, Kubovcik & Murray

[57] ABSTRACT

A thermal cracking apparatus for cracking organic or inorganic gases is described. More particularly, the thermal cracker cracks inorganic gases such as arsine and phosphine for use in the growth of III-V compound semiconductor layers. The design of the apparatus minimizes the uptake of contaminants into the cracked gas stream.

6 Claims, 1 Drawing Sheet

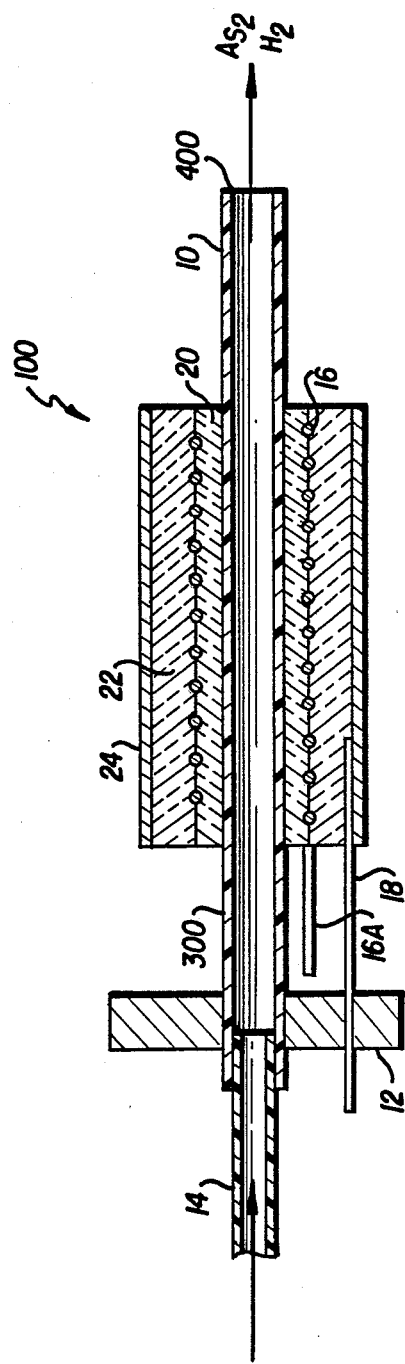

GASEOUS ORGANIC/INORGANIC THERMAL CRACKER FOR VACUUM CHEMICAL EPITAXY

This application is a continuation of application Ser. No. 941,003, filed Dec. 12, 1986, now abandoned.

This invention relates to an apparatus capable of disassociating gaseous compounds. More specifically, this invention relates to a thermal cracking apparatus capable of disassociating organic or inorganic gaseous compounds and particularly to an apparatus capable of disassociating organic or inorganic compounds in the gaseous state by vacuum chemical epitaxy, (VCE).

BACKGROUND OF THE INVENTION

Various processes of fabricating III-V compound semiconductor layers require the use of arsenic and phosphorous in, for example, gallium arsenide, gallium phosphide, gallium arsenide phosphide, and the like. With molecular beam epitaxy, (MBE), elemental arsenic and phosphorous are often heated to obtain the species necessary to grow the desired semiconductor layers. However, the species of arsenic, i.e., $As_4$, derived from heating elemental arsenic or phosphorous are difficult to handle and the polymer from leads to point defects or regions of high phosphorous or arsenic concentrations in the growing layer. To avoid these problems, phosphine, $Ph_3$, and arsine, $AsH_3$, have been used in chemical vapor deposition, (CVD), and MBE growth processes. These materials are generally broken down into smaller molecules or components by heating the molecule above its bond breaking temperature, i.e., "cracked" into useful species of $P_2$ and $As_2$ by passing them through a heated zone to liberated the hydrogen as $H_2$ gas. The process of using the gas in a heated atmosphere to break down the arsine and phosphine is generally referred to as thermal cracking.

Thermal crackers in the past have involved a tube through which the gas is passed coming into direct contact with a heating wire such as a material made from tungsten and tantalum. Although these devices are capable of cracking the gases, the process of subjecting the gases to direct contact with the heater wire permits the incorporation of impurities in the gas, both tantalum or tungsten and other impurities during the process of heating the filament to a temperature sufficiently high to crack the gas. In addition, the heating filament lifetime is shortened by coming into direct contact with the gas or gases during the heating operation.

Prior art designs of thermal cracking quartz furnaces have had difficulty in producing the desired species of arsenic from arsine $AsH_3$. L. W. Kapitan, *J. Vac Science Technology*, B2(2), pp. 280-284, April-June 1984, proposed a solution to this problem by inserting a tantalum heating wire within the cracking furnace. Although this produced acceptable results, it suffers from the possible contamination of the gases due to the normal breakdown of the wire and the chemical reactions with the gases to be cracked.

As the use of III-V compound materials gains increasing economic importance in the photovoltaic and semiconductor industries, the researchers have increasingly looked toward techniques which are scalable to mass production items. VCE is a highly promising growth technique for meeting the economic needs for the high volume production of III-V compound semiconductor devices. The technique involves, among other things, the controllability of MBE with the ease of scaling of CVD while minimizing the amounts of toxic gaseous by-products and high temperature handling problems. To maintain the purity of the semiconductor layers it would be desirable to have an apparatus which is capable of thermally cracking phosphine, arsine, or organic compounds such as trimethyl or triethyl gallium. It would also be desirable to have an apparatus which is capable of cracking these gases with a minimum of contamination in the process while not exposing the heater element to the actual cracked gases which can create shortened lifetime and/or create memory problems in the VCE apparatus through absorption of the gases onto the heating filament wire.

SUMMARY OF THE INVENTION

We have invented an apparatus which possesses the previously-recited desirable features and many other benefits which are readily apparent to the ordinary skilled artisan. The apparatus can thermally crack organic and inorganic gases and provide the necessary semiconductor species for epitaxal layer growth without bringing the gases into direct contact with the heating filament. The invention also provides for the capability of thermally monitoring the cracking temperature to adjust the rate of cracking.

BRIEF DESCRIPTION OF THE DRAWING

The drawing illustrates a cross-sectional view of an embodiment of a thermal cracker according to our invention.

DETAILED DESCRIPTION OF THE INVENTION

The invention will be more clearly illustrated by referring to the FIGURE. The FIGURE illustrates an organic/inorganic thermal cracker 100.

Thermal cracker 100 includes a central elongate tube 10 of graphite or other suitable material which is stable at cracking temperatures and does not add deleterious impurities to the cracked gas stream. Prior art heaters have used quartz tubes which disassociate at thermal cracking temperatures to inject silicon and oxygen atom impurities into the gaseous stream during the semiconductor layer-fabrication. Graphite is stable in a reducing environment. The tube 10 is connected to a vacuum seal and flange 12 which fits into the wall of the vacuum chamber, the tube 10 connects to the outside of the chamber through a suitable gas-carrying tube 14 such as a stainless steel tube or a graphite tube. Tube 14 connects to the arsine or phosphine gaseous sources. Surrounding the graphite tube is a heating coil 16 of tungsten-rhenium or other suitable heating wires. The heating-coil wire 16 is sandwiched between insulating tubes 20 and 22. Suitable insulating tubes can be fabricated from $Al_2O_3$ or like materials which are stable at the temperatures necessary to crack the gas and will not introduce any deleterious gaseous or ionic species into the vacuum chamber atmosphere.

The length of the heating coil 16 and the number of windings is a function of the amount of gas to be cracked and the rapidity with which the gas needs to be cracked. Preferably, the heating coil should be as short as possible to minimize the amount of heat injected into the vacuum chamber portion of the VCE apparatus. The heating wire 16 is connected to the outside through a suitable vacuum seal 12 via wire 16a.

A heat shield 24 surrounds the outer insulator tube 22. The heat shield 24 is fabricated from tantalum or any other suitable material capable of protecting the insulator tubes while maximizing the inward temperature profile and minimizing the amount of heat radiated to the surrounding vacuum chamber.

The thermal cracker temperature is monitored by a thermocouple 18 sandwiched between the tantalum heat shield and the outer insulator tube 22. The thermocouple is connected to the outside environment by a feed-through in vacuum flange 12. Alternatively, for a more direct gauge of the heat, the thermocouple can be embedded within the graphite tube 10 as close to the interior of the tube as possible.

In operation, the apparatus 100 is screwed into the wall of the vacuum chamber, the vacuum is reduced to the range of $10^{-5}$Torr or better, and preferably, between $10^{-7}$Torr to $10^{-8}$Torr while energizing the heater coil and introducing an inorganic gas such as arsine 300 through tube 14 into graphite tube 10. The flow rate of the arsine 300 is adjusted to achieve the desired amount of cracked arsenic as $As_2$ and $H_2$ gases 400 exiting the graphite tube to react with the III compound materials of gallium and the like, at the substrate surface to form the required III-V compound semiconductor layers The thermal cracker of our invention provides a straight-forward cracker apparatus and process of cracking gases without the requirement of catalytic wires or baffles or quartz surfaces which can contaminate the cracked gases.

Although the invention has been described with respect to particularly preferred embodiments, modifications which would be obvious to the ordinary skilled artisan are contemplated to be within the scope of the invention.

What is claimed is:

1. An apparatus for disassociating organic and/or inorganic gases by thermal means in a vacuum chamber comprising:
    a straight, hollow, empty open-ended graphite tube,
    flange means connected to one end of said graphite tube for mounting said apparatus substantially within the vacuum chamber,
    means for introducing gas to be cracked into said one end of said graphite tube so that the gas passes straight through the graphite tube while being disassociated,
    a first insulating tube surrounding a portion of said graphite tube,
    a heating coil of a heating wire for heating the gas to be cracked surrounding said first insulating tube,
    a second insulating tube surrounding said heating, and
    heat shield means surrounding said second insulating tube for maximizing inward temperature profile and minimizing the amount of heat radiated to the vacuum chamber.

2. The apparatus according to claim 1 wherein said first and second insulating tubes are $Al_2O_3$.

3. The apparatus according to claim 2 wherein said heating coil is a tungsten-rhenium heating wire.

4. The apparatus according to claim 3 wherein said heat shield means is a tantalum heat shield.

5. The apparatus according to claim 1 further comprising a thermocouple positioned between said second insulating tube and said heat shield means.

6. The apparatus according to claim 4 wherein said means for introducing gas comprises an inert metallic tube positioned within said flange means and inserted into said one end of said graphite tube.

* * * * *

UNITED STATES PATENT AND TRADEMARK OFFICE
CERTIFICATE OF CORRECTION

PATENT NO. : 4,900,518

DATED : February 13, 1990

INVENTOR(S) : McLEOD et al

It is certified that error appears in the above-identified patent and that said Letters Patent is hereby corrected as shown below:

Column 3, line 24, "layers The" should read --layers. The--.

line 16, "surrounding said heating," should read --surrounding said heating wire,--.

Signed and Sealed this

Fifteenth Day of October, 1991

Attest:

HARRY F. MANBECK, JR.

Attesting Officer

Commissioner of Patents and Trademarks